United States Patent
De Smit et al.

(10) Patent No.: US 7,317,504 B2
(45) Date of Patent: Jan. 8, 2008

(54) LITHOGRAPHIC APPARATUS AND DEVICE MANUFACTURING METHOD

(75) Inventors: Joannes Theodoor De Smit, Eindhoven (NL); Vadim Yevgenyevich Banine, Helmond (NL); Theodorus Hubertus Josephus Bisschops, Eindhoven (NL); Theodorus Marinus Modderman, Nuenen (NL); Marcel Mathijs Theodore Marie Dierichs, Venlo (NL)

(73) Assignee: ASML Netherlands B.V., Veldhoven (NL)

( * ) Notice: Subject to any disclaimer, the term of this patent is extended or adjusted under 35 U.S.C. 154(b) by 56 days.

(21) Appl. No.: 10/820,227

(22) Filed: Apr. 8, 2004

(65) Prior Publication Data

US 2005/0225734 A1    Oct. 13, 2005

(51) Int. Cl.
  G03B 27/52 (2006.01)
  G03B 27/42 (2006.01)
  G03B 27/32 (2006.01)
  G03C 5/00 (2006.01)
  B06B 1/00 (2006.01)

(52) U.S. Cl. ............... 355/30; 355/53; 355/77; 430/30; 430/311; 427/600; 427/553

(58) Field of Classification Search .......... 355/30, 355/53; 430/30, 311; 356/237.1; 427/600, 427/560, 553
See application file for complete search history.

(56) References Cited

U.S. PATENT DOCUMENTS

| | | | |
|---|---|---|---|
| 3,573,975 A | 4/1971 | Dhaka et al. | ............... 117/212 |
| 3,648,587 A | 3/1972 | Stevens | ............................ 95/44 |
| 4,346,164 A | 8/1982 | Tabarelli et al. | ............ 430/311 |
| 4,390,273 A | 6/1983 | Loebach et al. | |
| 4,396,705 A | 8/1983 | Akeyama et al. | ........... 430/326 |
| 4,468,120 A | 8/1984 | Tanimoto et al. | |
| 4,480,910 A | 11/1984 | Takanashi et al. | ............ 355/30 |
| 4,509,852 A | 4/1985 | Tabarelli et al. | |
| 5,040,020 A | 8/1991 | Rauschenbach et al. | ...... 355/53 |

(Continued)

FOREIGN PATENT DOCUMENTS

DE    206 607    2/1984

(Continued)

OTHER PUBLICATIONS

U.S. Appl. No. 10/775,326, filed Feb. 11, 2004, Dierichs.

(Continued)

*Primary Examiner*—Alan Mathews
(74) *Attorney, Agent, or Firm*—Pillsbury Winthrop Shaw Pittman LLP

(57) ABSTRACT

A lithographic apparatus and device manufacturing method makes use of a high refractive index liquid confined in a reservoir 13 at least partly filling the imaging field between the final element of the projection lens and the substrate. Bubbles forming in the liquid from dissolved atmospheric gases or from out-gassing from apparatus elements exposed to the liquid are detected and removed so that they do not interfere with exposure and lead to printing defects on the substrate. Detection can be carried out by measuring the frequency dependence of ultrasonic attenuation in the liquid and bubble removal can be implemented by degassing and pressurizing the liquid, isolating the liquid from the atmosphere, using liquids of low surface tension, providing a continuous flow of liquid through the imaging field, and phase shifting ultrasonic standing-wave node patterns.

24 Claims, 15 Drawing Sheets

U.S. PATENT DOCUMENTS

| | | | |
|---|---|---|---|
| 5,121,256 A | 6/1992 | Corle et al. .................. 359/664 |
| 5,229,872 A | 7/1993 | Mumola |
| 5,257,128 A | 10/1993 | Diller et al. |
| 5,296,891 A | 3/1994 | Vogt et al. |
| 5,523,193 A | 6/1996 | Nelson |
| 5,587,794 A | 12/1996 | Mizutani et al. |
| 5,610,683 A | 3/1997 | Takahashi .................... 355/53 |
| 5,715,039 A | 2/1998 | Fukuda et al. ................ 355/53 |
| 5,825,043 A | 10/1998 | Suwa ........................ 250/548 |
| 5,900,354 A | 5/1999 | Batchelder .................. 430/395 |
| 5,969,441 A | 10/1999 | Loopstra et al. |
| 6,046,792 A | 4/2000 | Van Der Werf et al. |
| 6,191,429 B1 | 2/2001 | Suwa ........................ 250/548 |
| 6,236,634 B1 | 5/2001 | Lee et al. |
| 6,301,055 B1 | 10/2001 | Legrand et al. |
| 6,343,422 B1* | 2/2002 | Takahashi ................ 33/366.16 |
| 6,560,032 B2 | 5/2003 | Hatano ....................... 359/656 |
| 6,600,547 B2 | 7/2003 | Watson et al. |
| 6,603,130 B1 | 8/2003 | Bisschops et al. ........ 250/492.1 |
| 6,633,365 B2 | 10/2003 | Suenaga ...................... 355/53 |
| 6,788,477 B2 | 9/2004 | Lin |
| 7,061,578 B2 | 6/2006 | Levinson |
| 2002/0020821 A1 | 2/2002 | Van Santen et al. |
| 2002/0163629 A1 | 11/2002 | Switkes et al. ............... 355/53 |
| 2003/0030916 A1 | 2/2003 | Suenaga |
| 2003/0123040 A1 | 7/2003 | Almogy ....................... 355/69 |
| 2003/0174408 A1 | 9/2003 | Rostalski et al. ........... 359/642 |
| 2004/0000627 A1 | 1/2004 | Schuster |
| 2004/0021844 A1 | 2/2004 | Suenaga |
| 2004/0075895 A1 | 4/2004 | Lin ............................ 359/380 |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik et al. |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2005/0024609 A1 | 2/2005 | De Smit et al. |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1* | 2/2005 | Levinson ...................... 430/30 |
| 2005/0046934 A1 | 3/2005 | Ho et al. |
| 2005/0048223 A1* | 3/2005 | Pawloski et al. ........... 427/600 |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0141098 A1 | 6/2005 | Schuster |
| 2005/0174549 A1* | 8/2005 | Duineveld et al. ............. 355/30 |
| 2005/0190455 A1 | 9/2005 | Rostalski et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2006/0126043 A1* | 6/2006 | Mizutani et al. ............... 355/53 |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 0 834 773 A2 | 4/1998 |
| EP | 1039511 | 9/2000 |
| FR | 2474708 | 7/1981 |
| JP | A 57-153433 | 9/1982 |
| JP | 58-202448 | 11/1983 |
| JP | A 59-19912 | 2/1984 |
| JP | 62-065326 | 3/1987 |
| JP | 62-121417 | 6/1987 |
| JP | 63-157419 | 6/1988 |
| JP | 04-190873 | 7/1992 |
| JP | 04-305915 | 10/1992 |
| JP | 04-305917 | 10/1992 |
| JP | A 05-62877 | 3/1993 |
| JP | A 05-304072 | 11/1993 |
| JP | 06-124873 | 5/1994 |
| JP | A 06-168866 | 6/1994 |
| JP | 06-254304 | 9/1994 |
| JP | 06-262005 | 9/1994 |
| JP | 07-132262 | 5/1995 |
| JP | 07-220990 | 8/1995 |
| JP | A 07-220990 | 8/1995 |
| JP | A 8-316125 | 11/1996 |
| JP | A 10-154659 | 6/1998 |
| JP | 10-228661 | 8/1998 |
| JP | 10-255319 | 9/1998 |
| JP | A 10-255319 | 9/1998 |
| JP | 10-303114 | 11/1998 |
| JP | 10-340846 | 12/1998 |
| JP | 11-176727 | 7/1999 |
| JP | A 11-176727 | 7/1999 |
| JP | 11-290752 | 10/1999 |
| JP | 2000-058436 | 2/2000 |
| JP | A 2000-58436 | 2/2000 |
| JP | 2001-091849 | 4/2001 |
| JP | 2001-121063 | 5/2001 |
| JP | 2001-175005 | 6/2001 |
| JP | 2002-236111 | 8/2002 |
| JP | 2004-193252 | 7/2004 |
| JP | 2004-207696 | 7/2004 |
| WO | WO98/33096 | 7/1998 |
| WO | WO98/38597 | 9/1998 |
| WO | WO98/40791 | 9/1998 |
| WO | WO99/49504 | 9/1999 |
| WO | WO 02/091078 A1 | 11/2002 |
| WO | WO 03/077036 | 9/2003 |
| WO | WO 03/077037 | 9/2003 |
| WO | WO2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |

| | | |
|---|---|---|
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/09230 A2 | 10/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/054953 A2 | 6/2005 |
| WO | WO 2005/054955 A2 | 6/2005 |
| WO | WO 2005/062128 A2 | 7/2005 |

OTHER PUBLICATIONS

U.S. Appl. No. 10/773,461, filed Feb. 9, 2004, Duineveld et al.
U.S. Appl. No. 10/698,012, filed Oct. 31, 2003, Flagello et al.
U.S. Appl. No. 10/705,804, filed Nov. 12, 2003, De Smit et al.
U.S. Appl. No. 10/705,805, filed Nov. 12, 2003, Lof et al.
U.S. Appl. No. 10/705,783, filed Nov. 12, 2003, Lof et al.
U.S. Appl. No. 10/743,271, filed Dec. 23, 2003, Van Santen et al.
U.S. Appl. No. 10/743,266, filed Dec. 23, 2003, Mulkens et al.
U.S. Appl. No. 10/705,785, filed Nov. 12, 2003, Derksen et al.
U.S. Appl. No. 10/724,402, filed Dec. 1, 2003, Simon et al.
U.S. Appl. No. 10/715,116, filed Nov. 18, 2003, Bleeker.
U.S. Appl. No. 10/719,683, filed Nov. 24, 2003, Streefkerk et al.
U.S. Appl. No. 10/705,816, filed Nov. 12, 2003, Lof et al.
U.S. Appl. No. 10/367,910, filed Feb. 19, 2003, Suwa et al.
Search Report for European Application No. 04253325.7, dated Jan. 20, 2005.
European Search Report issued for European Patent Application No. 04253325.7-1226 dated Mar. 20, 2006.
Korean Office Action for Korean Patent Application No. 10-2004-0042691, dated May 29, 2006.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths To Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2 µm Fine Patterns Using Optical Projection Lithography with an Oil Immersion Lens", Jpn. J. Appl. Phys. vol. 31 (1992), pp. 4174-4177.
G. Owen et al., "⅛µm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $k_3$ coefficient in nonparaxial λ/NA scaling equations for resolution, depth of focus, and immersion lithography, J. Microlith., Microfab., Microsyst. 1(1):7-12 (2002).
EP Search Report for EP 03253694.8 dated Mar. 30, 2004.
M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
United States Office Action issued for U.S. Appl. No. 11/345,392, dated Feb. 6, 2007.
United States Office Action issued for U.S. Appl. No. 11/345,392, dated May 12, 2006.
Japanese Official Action issued for Japanese Patent Application No. 2004-172029, dated Jun. 25, 2007.

* cited by examiner

LITHOGRAPHIC APPARATUS AND DEVICE MANUFACTURING METHOD

FIELD OF THE INVENTION

The present invention relates to a lithographic projection apparatus.

In particular, the present invention relates to a lithographic projection apparatus comprising a radiation system for supplying a projection beam of radiation, a support structure for supporting patterning means, the patterning means serving to pattern the projection beam according to a desired pattern, a substrate table for holding a substrate, a projection system for projecting the patterned beam onto a target portion of the substrate, and liquid supply system for at least partly filling a space between the final element of said projection system and said substrate with liquid.

SUMMARY

The term "patterning means" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning means include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning means can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as hereabove set forth.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference. Where reference is made to "ultrasonic" or "ultrasound", unless stated otherwise, this is to be interpreted as relating to sound waves at any frequency greater than the upper limit of human perception: namely, greater than 20 kHz.

It has been proposed to immerse the substrate in a lithographic projection apparatus in a liquid having a relatively high refractive index, e.g. water, so as to fill the space between the final element of the projection lens and the substrate. The point of this is to enable imaging of smaller features since the exposure radiation will have a shorter wavelength in the liquid. (The effect of the liquid may also be regarded as increasing the effective NA of the system.)

One of the solutions proposed is to submerse the substrate or substrate and substrate table in a bath of liquid (see for example U.S. Pat. No. 4,509,852, hereby incorporated in its entirety by reference). In this solution, there is a large body of liquid that must be accelerated during a scanning exposure. This may require additional or more powerful motors and may cause turbulence in the liquid leading to possible undesirable and unpredictable effects.

Another of the solutions proposed is for a liquid supply system to provide liquid in a localized area between the final element of the projection system and the substrate (the substrate generally has a larger surface area than the final element of the projection system). One way that has been proposed to arrange for this is disclosed in WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of inlets and outlets positioned around the final element are possible, one example is illustrated in FIG. 3 in which four sets of an inlet with an outlet on either side are provided in a regular pattern around the final element.

Another solution that has been proposed is to provide the liquid supply system with a seal member which extends along at least a part of a boundary of the space between the final element of the projection system and the substrate table. The seal member is substantially stationary relative to the projection system in the XY plane and a seal is formed between the seal member and the surface of the substrate. Preferably the seal is a contactless seal such as a gas seal (see, for example, European patent application 03252955.4 hereby incorporated in its entirety by reference).

Unexpected disadvantages emerge from this new technology when compared with systems that do not have liquid in the exposure radiation path. In particular, despite the improved imaging resolution, the liquid tends to degrade the image quality in other respects.

It is an object of the present invention to improve the imaging performance of an apparatus having a liquid filling a space between the final element of the projection system and the substrate.

This and other objects are achieved according to the invention in a lithographic apparatus as specified in the opening paragraph, characterized in that the liquid supply system comprises bubble reduction means.

It has been realized that an important source of image degradation is the scattering of imaging radiation from bubbles in the liquid. By reducing the size and concentration of these bubbles it is possible to reduce this scattering and the associated distortion of the image reaching the substrate, thereby reducing the frequency and magnitude of defects in the printed pattern on the substrate. Bubbles typically form when dissolved gases from the atmosphere come out of solution due to a disturbance of some kind, or from outgassing elements of the lithographic apparatus, such as a photosensitive layer on the substrate. Bubbles thus formed may vary greatly in number density and size distribution depending on the liquid, gases and disturbances involved. Very fine bubbles tend to cause particular problems as they are both difficult to detect and hard to remove using standard methods and yet still influence the image formed on the substrate. For use in the context of a typical lithographic apparatus, for example, bubbles continue to degrade performance down to around 10 nm in diameter.

The bubble reduction means may comprise bubble detection means. It is preferred that the bubble detection means comprise one or more ultrasonic transducers. These transducers may emit ultrasonic waves and receive ultrasonic waves that are influenced by the presence of bubbles in the liquid within which they propagate. The information yielded by the ultrasonic transducers may include information about the distribution of bubble sizes as well as their number density.

The ultrasonic transducers may also measure the ultrasonic attenuation as a function of frequency. The advantage of this approach is that it is possible to detect bubbles with dimensions very much smaller than the wavelength of the ultrasonic waves. Using only the amplitude of the signal would restrict this measurement method to bubbles of the same size or greater than the wavelength of the ultrasonic waves.

A further feature is that the bubble reduction means comprises a bubble removal means.

The bubble removal means may comprise a degassing device, the degassing device comprising an isolation chamber, wherein a space above liquid in the isolation chamber is maintained at a pressure below atmospheric pressure encouraging previously dissolved gases to come out of solution and be pumped away. This degassing process dramatically reduces the occurrence of bubbles due to dissolved atmospheric gases coming out of solution. Following the degassing process, the liquid is preferably kept as isolated as possible from the normal atmosphere.

A further feature is that the bubble removal means provide a continuous flow of liquid over the final element of the projection system and the substrate in order to transport bubbles out of the imaging field. This step is particularly effective for removing gases originating from out-gassing elements of the lithographic apparatus.

Additionally, the bubble reduction means may pressurize the liquid above atmospheric pressure to minimize the size of bubbles and encourage bubble-forming gases to dissolve into the liquid.

The composition of the liquid may also be chosen to have a lower surface tension than water. This reduces the tendency of bubbles to stick to the substrate where they may be particularly damaging to the image and where they tend to be resistant to removal measures. The tendency of bubbles to stick to the substrate and other components may be reduced by controlling the surface finish in contact with the immersion liquid. In particular, the surface finish may be polished or arranged to have a minimal surface roughness, preferably with a characteristic length scale of less than 0.5 μm.

The bubble reduction means may treat the liquid before it is introduced into the space between the final element of the projection system and the substrate. An advantage of this approach is improved space considerations and liberty of design. These factors make it easier to treat liquid in bulk for use in a plurality of lithographic apparatuses or for use in a circulatory system or where the liquid is to be replaced on a frequent basis. After treatment, the liquid may be protected from atmospheric gases by being kept under vacuum or by being exposed only to a gas, such as nitrogen, argon or helium, which does not easily dissolve into the liquid.

The ultrasonic transducers of the bubble detection means may be arranged in a pulse-echo arrangement wherein the same transducer emits waves and, after reflection from a boundary, receives waves attenuated by propagation through the liquid. An advantage of this arrangement is that fewer transducers are required and it is easier to arrange a relatively long signal path through the liquid.

Alternatively, the bubble detection means may comprise two spatially separated ultrasonic transducers, the first arranged to transmit, and the second to receive waves. An advantage of this arrangement is that the signal received at the receiving transducer may be easier to interpret and may suffer less from anomalous signal loss caused, for example, by non-specular reflection from the boundary.

Optionally, the bubble removal means may include two spatially separated ultrasonic transducers, arranged to produce ultrasonic standing-wave patterns within the liquid that trap bubbles within the nodal regions. The bubble removal means is arranged to displace said bubbles through the use of phase adjusting means linked with the transducers, the phase adjusting means causing spatial shift of the nodal regions and of bubbles trapped within them. This process may be used to transport bubbles completely to one side of a liquid reservoir where they may be isolated and removed from the system.

The ultrasonic transducers may preferably operate at megasonic frequencies (in the region of 1 MHz). Megasonic waves avoid some of the disadvantages of conventional (lower frequency) ultrasonic waves such as cavitation and bubble collision with solid surfaces, which results in small particles being dislodged and contaminating the liquid.

The bubble removal means may comprise an electric field generator for applying an electric field to the liquid, which electric field being capable of dislodging bubbles attached to interfaces within the liquid. This feature may be particularly useful where an interface in question is the substrate, as bubbles attached here are at the focus of the lithographic projection apparatus and may therefore distort the image more severely. The electric field lines are distorted in the vicinity of the bubble, which has a dielectric constant different from that of the surrounding liquid. This embodiment works on the basis that when the bubble is close to, or in contact with, an interface, the electric field distribution may be such as to force the bubble away from the surface and into the bulk of the liquid. Once in the bulk of the liquid, the bubble has a less detrimental effect on image quality, and may also be more easily removed. This method is applicable even where the surface to which the bubble has attached is hydrophobic and reduces the need to apply special hydrophilic coatings to the substrate.

The bubble removal means may comprise a selective heater for selectively controlling the temperature and therefore the size of bubbles according to their composition. By selecting to heat only the bubbles and not the surrounding liquid, it is possible to minimize unnecessary variations in the liquid temperature. Increasing the temperature of the bubbles causes them to expand in size and therefore become easier to remove. The selective heater may comprise a microwave source, operating at frequencies that correspond to the resonant frequencies of the gas molecules forming the bubbles (commonly nitrogen and oxygen). Given the temperature sensitivity of the lithographic apparatus in the region of the substrate, this method allows more extensive heating of the gas within the bubbles than would be the case if the liquid and bubbles had to be heated simultaneously. The result is a more energy and time efficient method for removing bubbles from the liquid.

The bubble removal means may comprise a particle input device for introducing particles into the liquid, and a particle removal device for removing the particles from the liquid. This method operates on the principle that, where the particles are chosen so that it is energetically or otherwise favorable, gas bubbles tend to attach to the surface of particles present in the liquid. Cumulatively, the particles present a large surface area to the liquid, which increases the chances of contact between particle and bubble. The surface in question may comprise the outer surface, and, where the particles are porous, the internal surface associated with the pores. Porous particles therefore provide a larger particle surface in contact with the liquid than non-porous particles. This embodiment is particularly effective when the particles are arranged to have a surface that repels the liquid (i.e. a surface that has a high interface energy with the liquid). In the case of a liquid comprising water, such a surface may be described as hydrophobic. This arrangement favors attachment of the bubbles as they act to reduce the particle surface area in contact with the liquid, thus minimizing the surface energy. There may also be an electrostatic attraction between the bubble and particle, or other surface characteristics of the particle that favor attachment of bubbles.

Gas bubbles that become attached to the particles are removed from the liquid when the particles are removed from the liquid by the particle removal device. The particle removal device may comprise a particle filter. In general, the dimensions of the particle are chosen to make them easy to remove, and this method provides an efficient means for removing even very fine bubbles.

The bubble detection means may comprise a light source, a light detector and a light comparator. The light source and the light detector may be arranged so that light emitted by the source propagates between the source and the detector through a portion of the liquid, the comparator being arranged to detect changes in the proportion of the emitted light that arrives at the detector after propagation through a portion of the liquid. The presence of bubbles in the liquid causes the light to be scattered. Depending on the arrangement of the source and the detector, this scattering may cause an increase or a decrease in the signal detected at the detector and may be analyzed to provide information about the population of bubbles. An advantage of this arrangement is that it can be operated continuously, even when the projection apparatus is in normal operation. When bubbles occur, they can be detected at an early stage and exposure can be suspended until the liquid is clear again. This feature therefore minimizes lost time, and also reduces the quantity of poorly exposed substrates that are produced.

According to a further aspect of the invention there is provided a lithographic projection apparatus comprising:

a radiation system for providing a projection beam of radiation;

a support structure for supporting patterning means, the patterning means serving to pattern the projection beam according to a desired pattern;

a substrate table for holding a substrate;

a projection system for projecting the patterned beam onto a target portion of the substrate;

a liquid supply system for at least partly filling a space between the final element of said projection system and said substrate with liquid; and a detection system for detecting impurities in said liquid, including a light source, a light detector and a light comparator, said light source and said light detector being arranged so that light emitted by said source propagates between said source and said detector through a portion of said liquid, said comparator being arranged to detect changes in the proportion of said emitted light that arrives at said detector after propagation through a portion of said liquid.

The detection system may be arranged to detect particles in the liquid between the final element of the projection system and the substrate. Particles may be introduced deliberately in order to control optical properties of the liquid and enhance the performance of the lithographic apparatus. This may be achieved, for example, by a fine suspension of quartz particles. In this case, the detection system may be used to verify that the particles are present in the desired proportions. Alternatively, damaging particles may enter the system by accident, such as those that break away from surfaces in contact with the immersion liquid. In this case, the detection system may be used to detect these particles and initiate an alarm procedure when the particle concentration and/or size distribution exceeds predetermined thresholds. Early detection of problems (whether a lack of desired particles or an excess of undesirable particles) allows corrective action to be taken promptly and helps to minimize loss of time and materials associated with substandard imaging.

According to a further aspect of the invention there is provided a device manufacturing method comprising the steps of:

providing a substrate that is at least partially covered by a layer of radiation-sensitive material;

providing a projection beam of radiation using a radiation system;

using patterning means to endow the projection beam with a pattern in its cross-section;

projecting the patterned beam of radiation onto a target portion of the layer of radiation-sensitive material;

providing a liquid supply system for filling the space between the final element of the projection system and said substrate with liquid; and reducing bubbles in said liquid supply system.

According to a still further aspect of the invention there is provided a lithographic projection apparatus comprising:

a radiation system for providing a projection beam of radiation;

a support structure for supporting patterning means, the patterning means serving to pattern the projection beam according to a desired pattern;

a substrate table for holding a substrate;

a projection system for projecting the patterned beam onto a target portion of the substrate;

a liquid supply system for at least partly filling a space between the final element of said projection system and said substrate with liquid; and a liquid quality monitor capable of switching the operational state of the projection apparatus between an active state and a suspended state, said active state being selected when the liquid quality is determined to be above a predefined threshold and said suspended state being selected when the liquid quality is determined to be below a predefined threshold.

This feature allows early detection of faults, and avoids unnecessary loss of time and material due to faulty exposure of the substrates. The predefined thresholds may be based on parameters such as limits on the size and/or number distribution of bubbles as detected by the bubble detection means. Alternatively, the predefined thresholds may relate to limits on the size and/or number distribution of other particles in the liquid.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm).

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION OF ILLUSTRATED EMBODIMENTS

Embodiment 1

Figure 1:
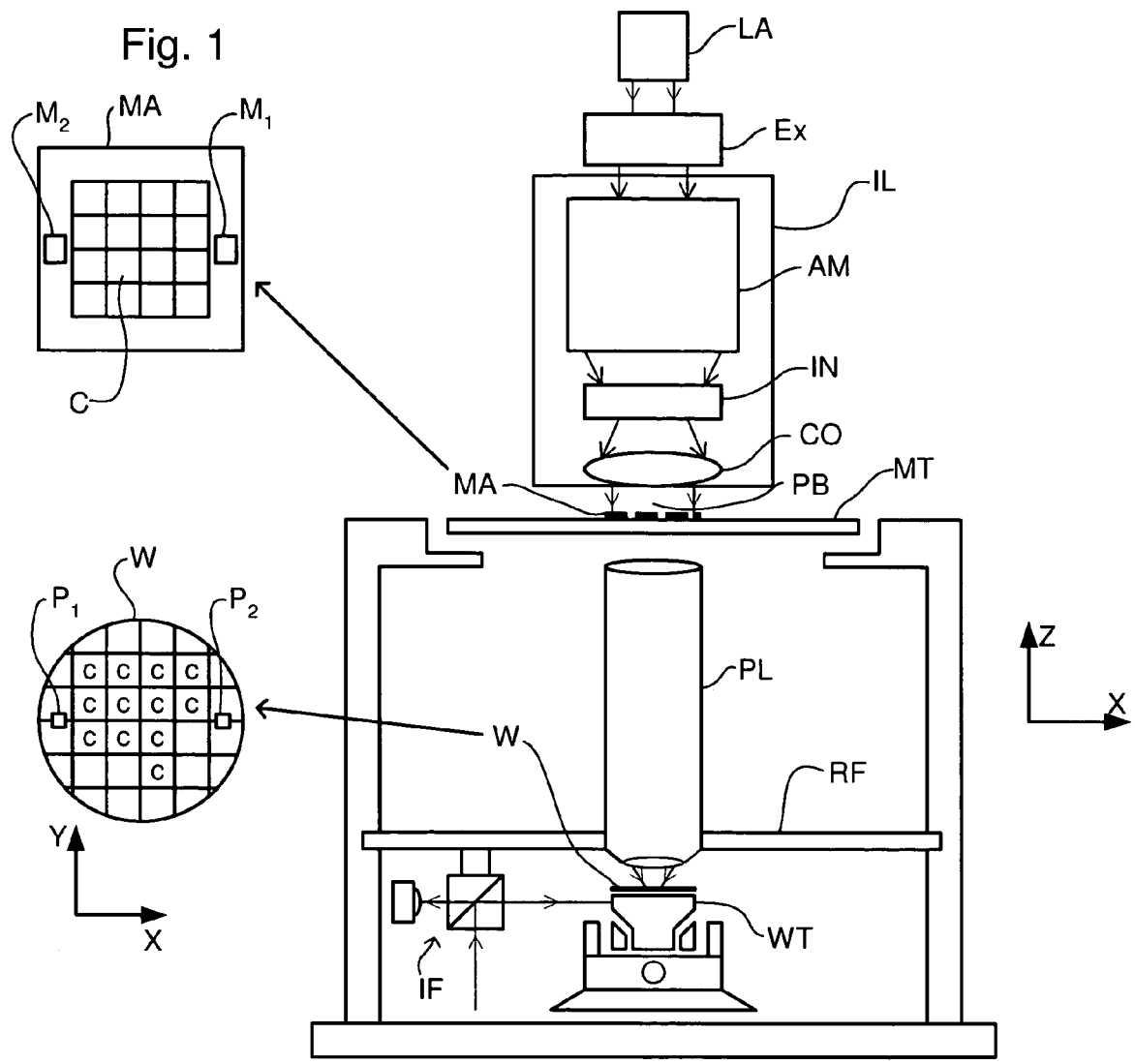
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. DUV radiation), which in this particular case also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive lens system) for imaging an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning means, such as a programmable mirror array of a type as referred to above.

The source LA (e.g. an excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
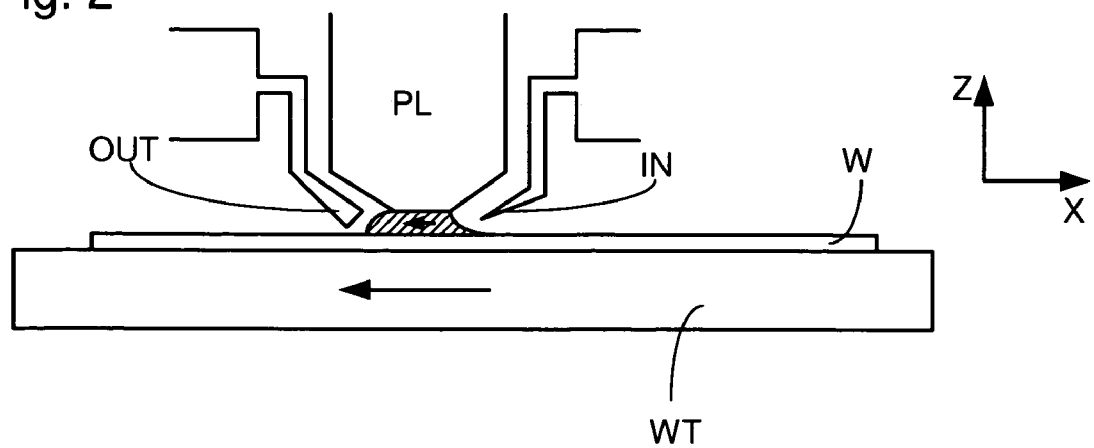
FIG. 2 depicts a liquid supply system for supplying liquid to the area around the final element of the projection system according to an embodiment of the invention.
Figure 3:
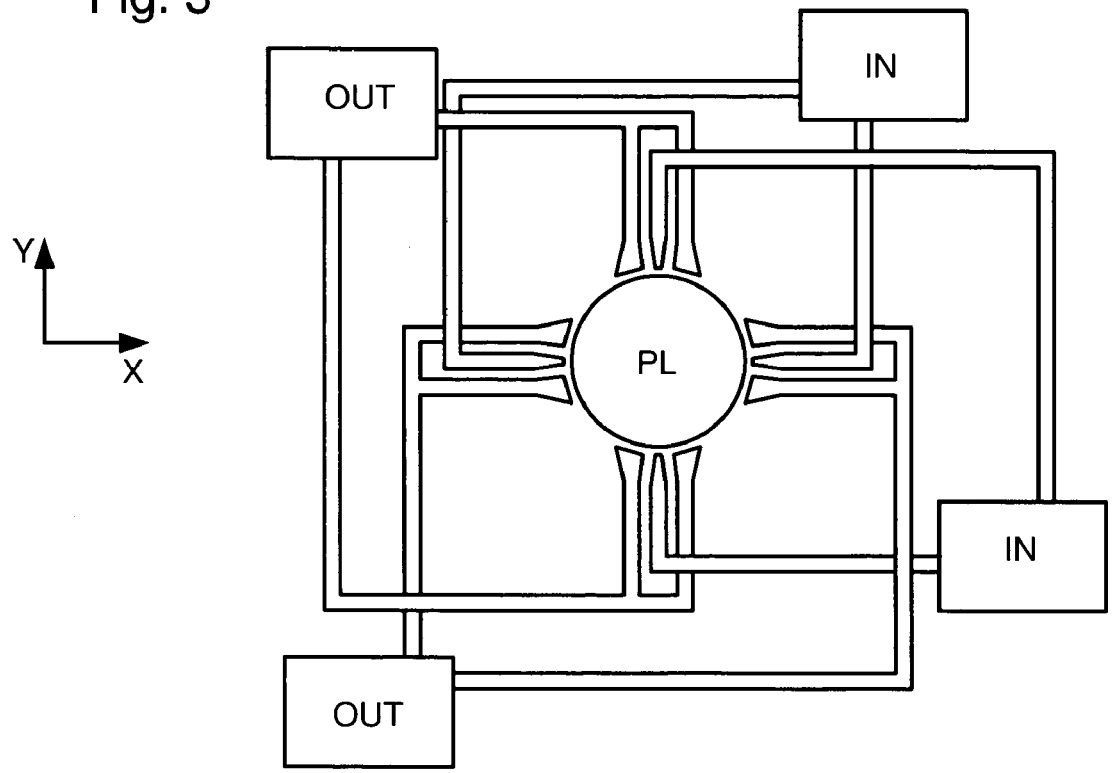
FIG. 3 depicts the arrangement of inlets and outlets of the liquid supply system of FIG. 2 around the final element of the projection system according to an embodiment of the invention.

FIGS. 2 and 3 depict a liquid supply system according to an embodiment of the invention and have been described above. Other liquid supply systems may be employed according to embodiments of the invention including, without limitation, a bath of liquid and seal member as described above.

Figure 4:
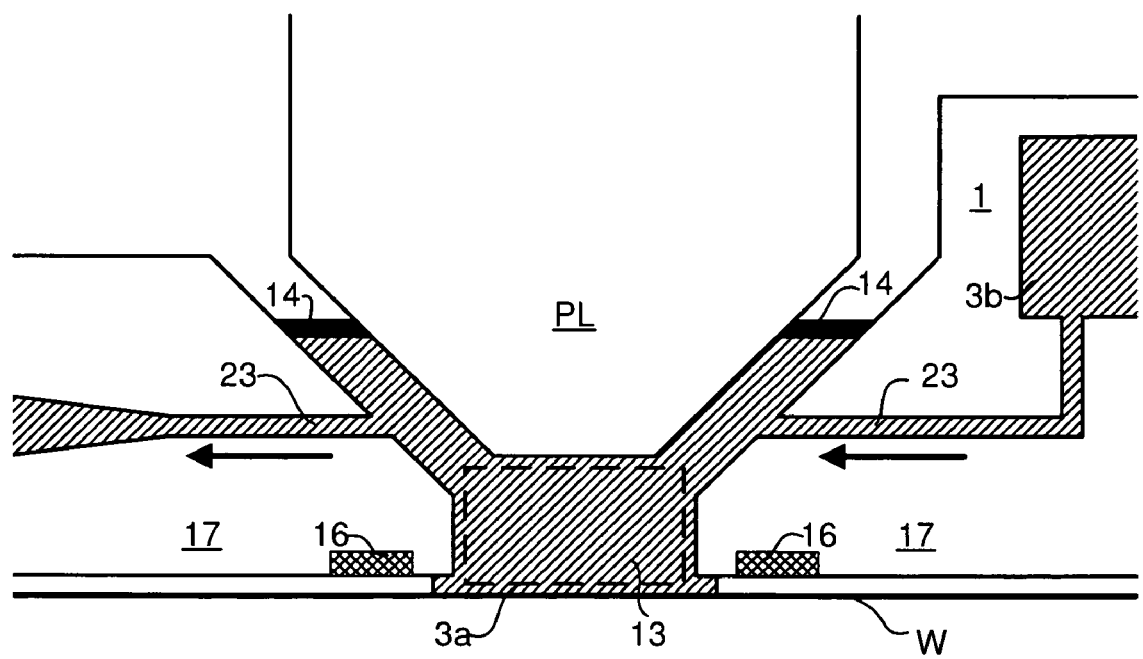
FIG. 4 depicts a liquid supply system with bubble reduction means according to an embodiment of the invention.

FIG. 4 shows the liquid supply system 1 and the bubble reduction means 3a/3b according to an embodiment of the invention. The bubble reduction means 3a/3b may be located underneath the projection lens 3a, or exterior to the imaging axis 3b. The liquid supply system 1 supplies liquid to a reservoir 13 between the projection lens PL and the wafer W. The liquid is preferably chosen to have a refractive index substantially greater than one meaning that the wavelength of the projection beam is shorter in the liquid than in air or a vacuum, allowing smaller features to be resolved. It is well known that the resolution of a projection system is determined, inter alia, by the wavelength of the projection beam and the numerical aperture of the system. The presence of the liquid may also be regarded as increasing the effective numerical aperture.

If the liquid has been exposed to the atmosphere, some atmospheric gases may be dissolved in the liquid. Disturbances of the fluid (in any way) may give rise to the formation of bubbles, which, depending on the liquid, gases and disturbances involved, may be very fine. Fine bubbles, down to around 10 nm in diameter, are very difficult to detect using standard methods but still interfere with the imaging performance of the exposure radiation, distorting the image and leading to printing defects on the wafer. Bubbles may also enter the reservoir 13 via out-gassing from elements within the lithographic apparatus such as the photosensitive layer on the substrate W when it is exposed.

The reservoir is bounded at least in part by a seal member 17 positioned below and surrounding the final element of the projection lens PL. The seal member 17 extends a little above the final element of the projection lens PL and the liquid level rises above the bottom end of the final element of the projection lens PL. The seal member 17 has an inner periphery that at the upper end closely conforms to the step of the projection system or the final element thereof and may, e.g., be round. At the bottom, the inner periphery closely conforms to the shape of the image field, e.g. rectangular but may be any shape.

Between the seal member 17 and the wafer W, the liquid can be confined to the reservoir by a contact-less seal 16, such as a gas seal formed by gas, e.g. nitrogen, argon, helium or similar that do not readily dissolve into the liquid, provided under pressure to the gap between the seal member 17 and the substrate W. Between the seal member 17 and the projection lens PL, the liquid is confined by sealing members 14, optionally to keep the liquid pressurized. Alternatively, the sealing members 14 may be omitted and the liquid confined by gravity.

The bubble reduction means 3 can comprise bubble removal means. FIG. 4 shows an aspect of the bubble removal means, wherein the liquid is made to flow continuously past the projection lens PL and substrate W. This action is particularly effective for transporting away bubbles from gas originating within the reservoir 13, e.g. those arising due to out-gassing from the substrate W. Liquid is introduced to the reservoir 13 through channels 23 formed at least partly in the seal member 17. These channels 23 may cooperate with channels for feeding the contact-less seal 16, which may consist of inlet and outlet ports for gas and/or liquid. For example, liquid may be sucked from the region of the reservoir nearest the contact-less seal 16 by a gas outlet port and arranged to feed the continuous flow.

Figure 5:
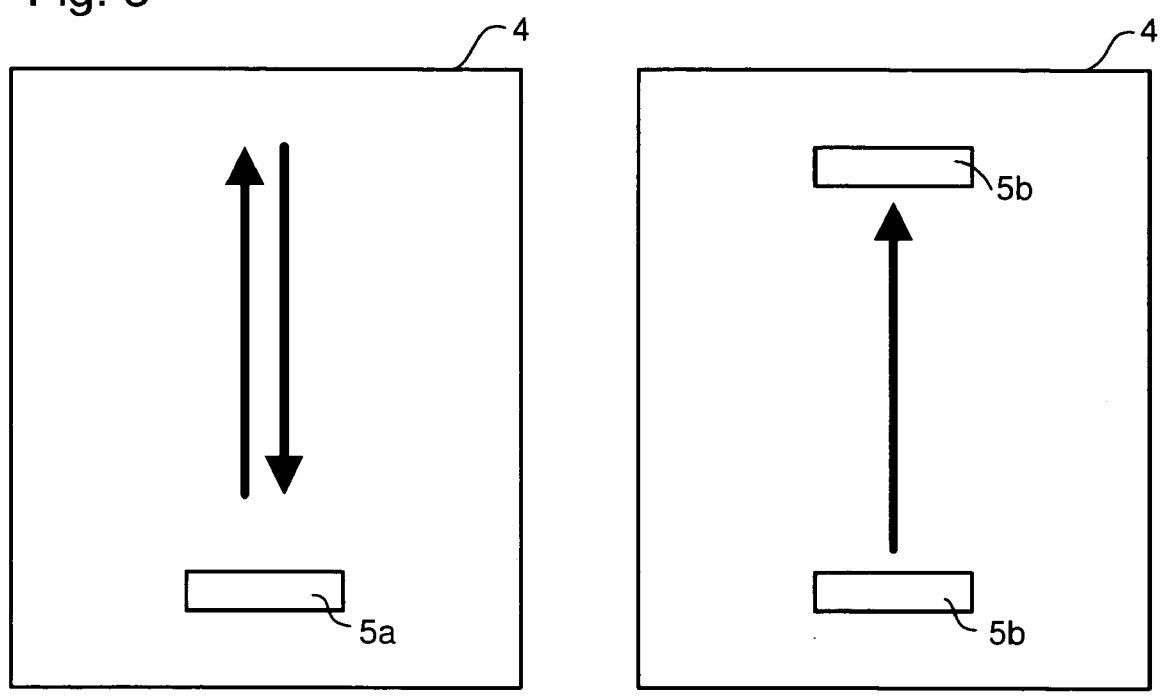
FIG. 5 depicts two possible arrangements of ultrasonic transducers in a bubble detection means according to two embodiments of the invention.

The bubble reduction means 3 can comprise bubble detection means 4. FIG. 5 shows two arrangements of ultrasonic transducers 5a/5b in the bubble detection means 4. The principle of detection used here is that the ultrasonic wave amplitude will be attenuated due to Rayleigh scattering from bubbles in the liquid. The ultrasonic attenuation is a function of the size distribution and the number density of bubbles (i.e. the number per unit volume). In the left diagram, an ultrasonic transducer emits a pulse that, after passing through the immersion liquid and reflecting from a boundary within the reservoir (whether reservoir 13 or some other reservoir, for example exterior to the imaging axis), is received by the same transducer 5a. This arrangement of transducer 5a is known as a "pulse-echo" arrangement. The pulse-echo arrangement is effective because it only requires a single transducer 5a and it is relatively easy to have a large propagation path between emission and detection thus helping to maximize the sensitivity to bubbles. However, it is possible that anomalous reflections occur causing loss of signal. The sampling rate may also be limited by the fact that it is necessary to wait for the return of a pulse before emitting a further pulse. Arranging the transducer 5a so that it can emit and receive concurrently may obviate this problem. An alternative arrangement is shown on the right of FIG. 5, using two transducers 5b each dedicated to either emitting or receiving ultrasonic waves. Here it is possible to emit rapid trains of pulses and the arrangement does not suffer from anomalous reflection effects since the wave pulses travel directly between the transducers 5b.

The attenuation is measured as a function of frequency in order to detect bubbles that are much smaller than the wavelength of the ultrasonic signals. This may be done using broadband transducers and excitations. Measuring attenuation at only a single frequency restricts detection to bubbles with diameters of the same order of size as or larger than the wavelength of the ultrasonic signals.

Figure 6:
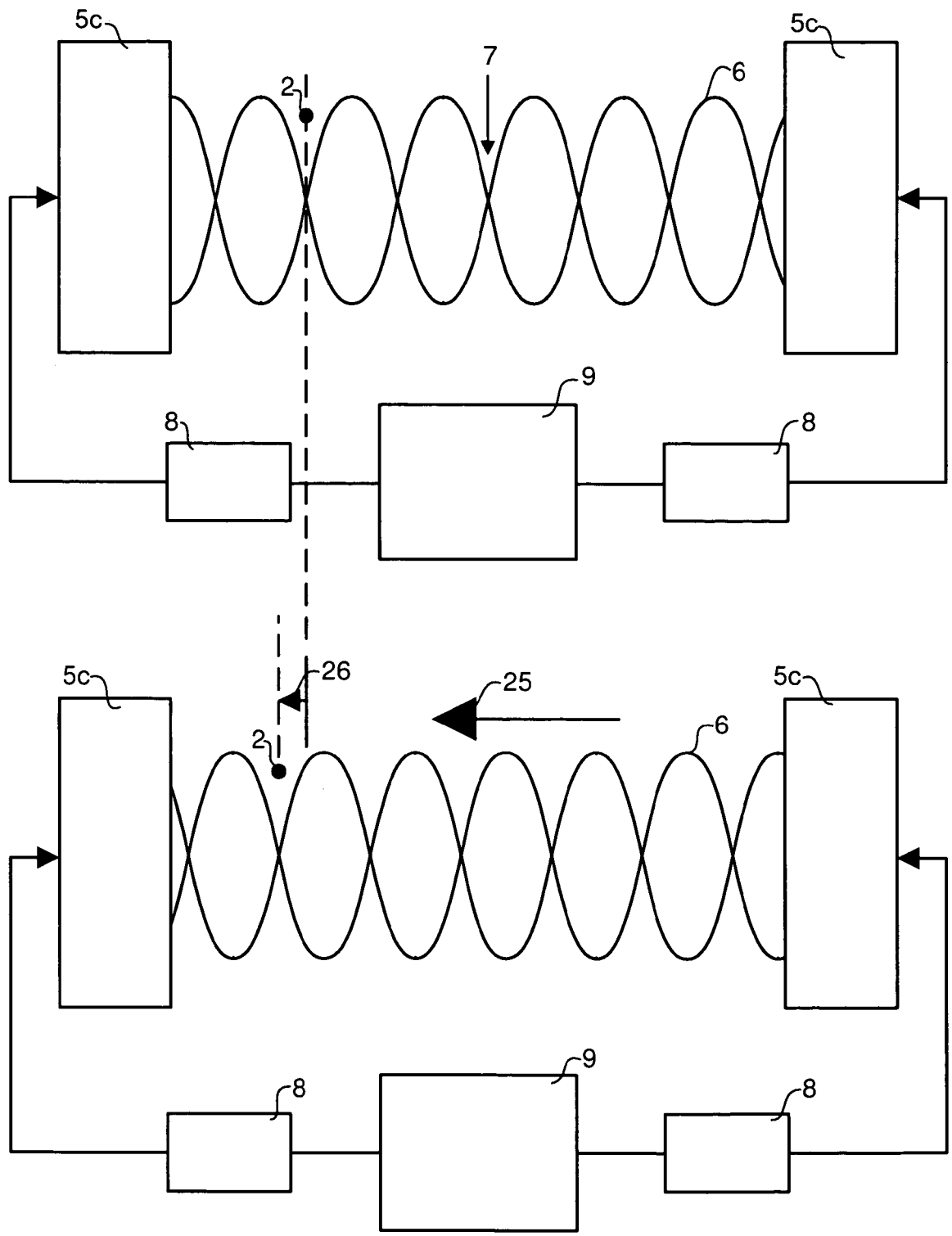
FIG. 6 depicts an arrangement of ultrasonic transducers and standing waves in a bubble removal means according to an embodiment of the invention.

FIG. 6 shows a further aspect of the bubble removal means according to an embodiment of the invention, wherein two ultrasonic transducers 5c powered by a signal generator 9 and phase shifted relative to each other by phase adjusting means 8 are arranged to produce a standing wave pattern 6 in the liquid between the faces of the transducers 5c. FIG. 6 shows a standing wave made up of interfering sine waves but the standing waves may be of any periodic form (e.g. square-wave or saw-tooth). The upper diagram represents the arrangement at a first instant and the lower diagram the same arrangement at a later instant. Bubbles present in the liquid (e.g. 2) tend to become localized near the nodal regions 7 of the standing wave 6. The phase adjusting means 8 act to shift the positions of the nodes towards one or the other of the two ultrasonic transducers 5c as shown by arrow 25. The trapped bubbles 2 move along with the moving nodes towards the transducer 5c in question and are therefore transported to an edge of a liquid reservoir. In FIG. 6, this movement is to the left as indicated by the arrow 26 and the displacement of the sample trapped bubble 2 indicated by the displaced vertical broken lines that pass through the center of the trapped bubble 2 at the two consecutive times. Once a certain concentration of bubbles has accumulated near one transducer 5c, the liquid in this region may be isolated and removed from the reservoir, carrying the bubbles with it.

The bubble removal means may work using ultrasonic waves as described in European Patent Application No. 03253694.8 hereby incorporated in its entirety by reference, or on similar principles using higher frequency waves known as megasonic waves (about 1 MHz) which avoid some of the disadvantages of conventional ultrasonic waves (which can lead to cavitation and bubble collision with walls resulting in small particles breaking off the walls and contaminating the liquid). As an alternative, the ultrasonic energy may be controlled, even with lower frequency ultrasound, to reduce the likelihood or extent of bubble cavitation. Additionally, ultrasound may be used to cause coalescence of smaller bubbles into larger bubbles which rise more quickly and may be more easily removed. Other bubble reduction means are also possible, for example those described in the above mentioned European Patent Application as well as the use of membranes perhaps in combination with a vacuum or by purging the liquid with a low solubility gas, such as helium. Membranes are already used for removal of gases from liquids in fields such as microelectronics, pharmaceutical and power applications. The liquid is pumped through a bundle of semi porous membrane tubing. The pores of the membrane are sized and the material chosen so that the liquid cannot pass through them but the gases to be removed can. Thus the liquid is degassed. The process can be accelerated by applying to the outside of the tubing a low pressure. Liqui-Cel (™) Membrane Contractors available from Membrana-Charlotte, a division of Celgard Inc. of Charlotte, N.C., USA are suitable for this purpose.

Purging with a low solubility gas is a known technique applied in high performance chromatography to prevent air bubble trapping in a reciprocating pump head. When the low solubility gas is purged through the liquid, it drives out other gases, such as carbon dioxide and oxygen.

Figure 7:
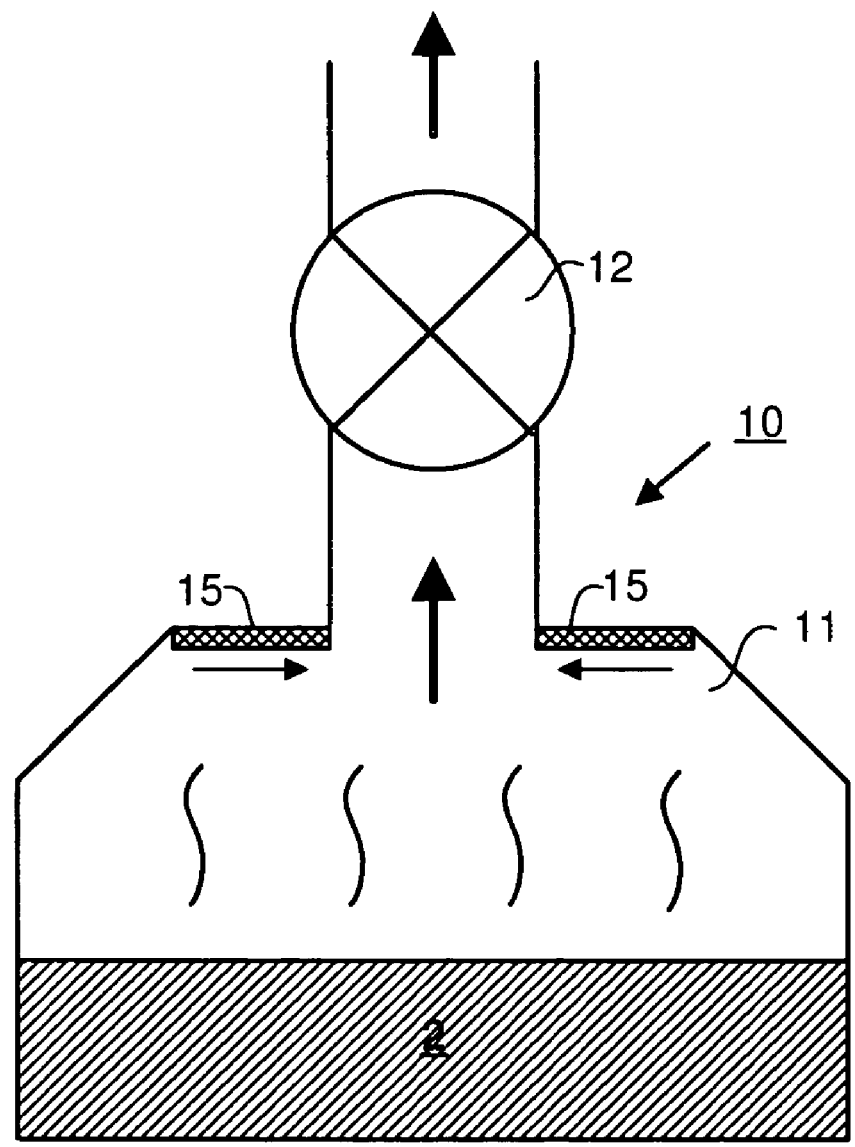
FIG. 7 depicts a degassing device according to an embodiment of the invention.

FIG. 7 shows the degassing device 10 of the bubble removal means according to an embodiment of the invention. The degassing device 10 comprises an isolation chamber 11, which contains the liquid to be degassed. The degassing device 10 may further comprise a pump 12 arranged to extract gases from the isolation chamber 11 and, eventually, to achieve a low pressure state therein. The minimum pressure is preferably chosen to be greater than the saturated vapor pressure of the liquid being used so as to prevent boiling, e.g. around 23 mbar for water at room temperature. Once under reduced pressure, gases dissolved in the liquid will leave solution and be pumped away by the pump 12. Raising the temperature of the liquid can assist this process. For example, working between 40 and 50° C. typically increases the degassing speed by about a factor of ten. When the degassing process is complete, i.e. when no further dissolved gas can be extracted from the liquid, the isolation chamber 11 may be isolated by closing doors 15 located above the liquid. The liquid should remain isolated from the atmosphere until it is transferred into the reservoir 13 for use. The liquid may be kept either under vacuum or under a gas that will not easily dissolve into the liquid, such as nitrogen, argon or helium.

Figure 8:
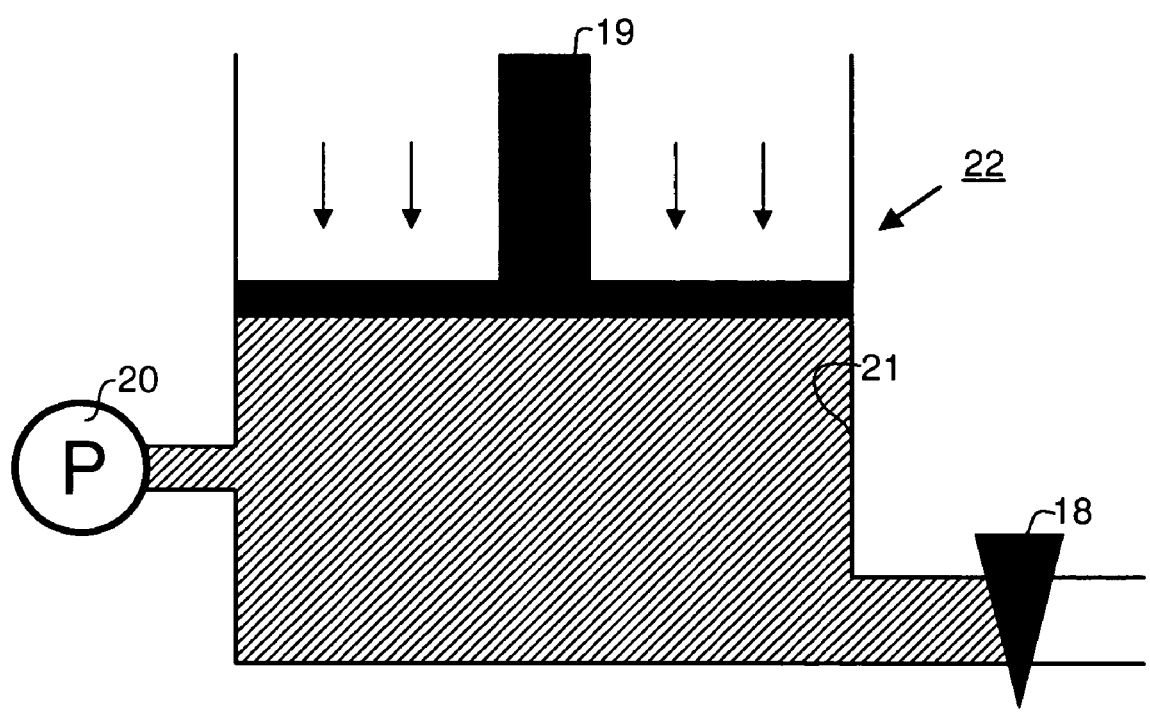
FIG. 8 depicts a liquid pressurization device according to an embodiment of the invention.

FIG. 8 shows a liquid pressurization device 22 that acts to pressurize the reservoir liquid above atmospheric pressure according to an embodiment of the invention. High pressure has the effect of minimizing the size of bubbles and encouraging bubbles to dissolve into the liquid. The apparatus shown in FIG. 8 consists of a piston 19 and a bore 21. Pushing the piston into the bore pressurizes the liquid. At its lower end, a valve 18 is provided to allow transfer of the liquid, for example into the liquid supply system 1. For monitoring purposes, a pressure gauge 20 is provided which may include a safety blow-off valve.

The bubble reduction means 3 may comprise elements both within the reservoir 13, as shown in FIG. 4, and outside the reservoir 13—see 3a and 3b respectively in FIG. 4. An advantage of having elements outside the exposure space 13 is that engineering considerations, such as the amount of space available or the allowable levels of vibrations and heat dissipation, are significantly relaxed. This fact not only makes it cheaper to design processing elements but also opens the possibility for bulk processing. Such bulk processing may allow a single station to prepare liquid for use in a number of lithographic apparatuses or to provide a large quantity of conditioned liquid for use in a system where there is a continual throughput of liquid, or in a system where the liquid is changed on a frequent basis.

Bubble reduction means 3 located within the reservoir 13 are particularly effective for dealing with bubbles that unavoidably originate within the reservoir 13, such as from out-gassing.

The composition of the liquid may be chosen to have a lower surface tension than water. This reduces the tendency of bubbles to stick to the substrate (particularly acute for small bubbles) where they may be particularly damaging to the image and where they tend to be resistant to removal measures. This may be achieved by choosing a pure liquid with a lower surface tension or by adding a component to the liquid that reduces its surface tension, such as a surfactant.

Figure 9:
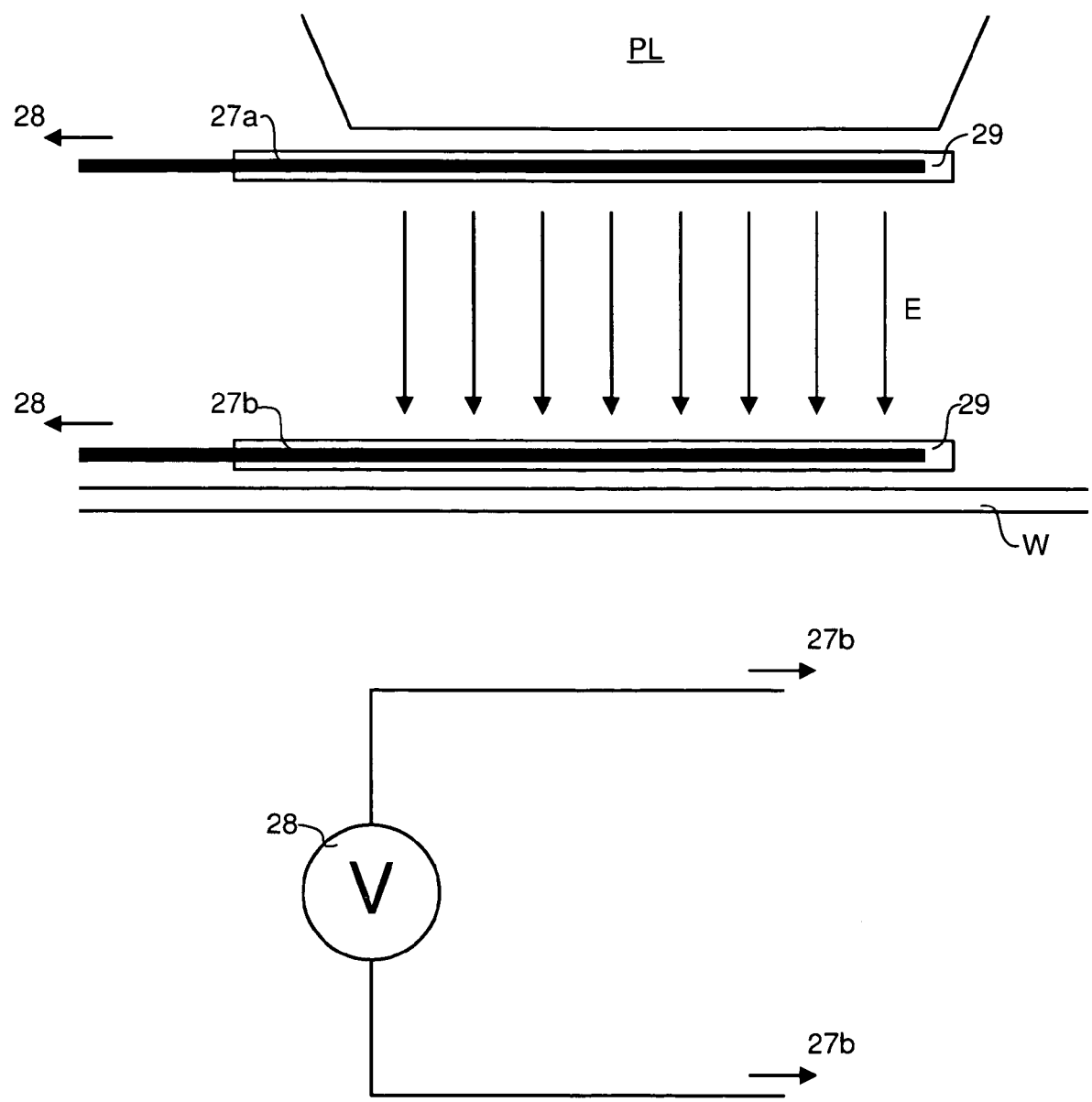
FIG. 9 depicts an embodiment of the bubble removal means showing a pair of protected electrodes and associated electric field generator.

Bubbles attached to the surface of the substrate W are particularly damaging because they are near the focus of the projection apparatus. The image is thus liable to be seriously distorted due to diffraction. An embodiment of the present invention provides a means for removing such bubbles and, more generally, bubbles attached to any interfaces within the immersion liquid. FIG. 9 illustrates one such embodiment, in this case directed towards removing bubbles from the substrate W. Here, two electrodes 27a and 27b are arranged in the region between the final element of the projection system PL and the substrate W and are each connected to terminals of an electrical power source 28. Alternatively, parts of the existing apparatus may be utilized as electrodes. For example, the substrate W may form one electrode in partnership with a second such as 27a. When energized, this arrangement produces a uniform electric field substantially parallel to the axis of the projection lens PL which extends to the region of liquid in close proximity to the target interface. Bubbles have a dielectric constant different from that of the surrounding liquid, which causes electric field lines to be distorted in the region around the bubble. When bubbles are close to an interface such as the substrate (W), the field lines may be distorted in such a way that the bubble experiences a force, which may be directed away from the surface in question and cause the bubble to deform and eventually break free from the surface and enter the bulk of the liquid. In the context of FIG. 9, the magnitude of the electric field may be arranged to overcome the pressure exerted on the bubble due to the liquid located above it and other opposing forces originating from factors such as surface tension. In a preferred embodiment the potential difference between the electrodes 27a and 27b is 100 volts DC. However, alternating voltage sources or a combination of alternating and direct voltage sources may be used. The critical parameter is the electric field strength, which depends on the magnitude of the potential difference and the separation between the electrodes. Furthermore, non-uniform and differently oriented fields may also be effective. This method will be applicable even when the surface of the substrate W is hydrophobic and there is a large energy barrier associated with deforming the bubble and disconnecting it from the surface. This means that it is no longer necessary specially to treat the surface of the substrate W such as by coating it with a hydrophilic coating.

A number of design considerations need to be taken into account. The conductivity of the liquid needs to be carefully controlled. In particular, it should not be too high, because this will make it difficult to create the electric field. Water with a resistivity of roughly 0.8 to 18.2 MOhm*cm may be used for example. Also, the electrodes 27a and 27b should preferably be protected from breakdown by isolating material 29 to prevent electrolysis and subsequent material breakdown. The conductivity and/or dielectric permittivity of the electrodes themselves should be high in comparison to the immersion liquid. One consequence of this will be to ensure that there is no appreciable fall in potential within the conductor material, which may help produce a uniform field between the electrodes.

It has been found that electrical forces may also cause adhesion between bubbles and solid particles dispersed in liquid. Bubbles in a liquid have, on their surface, an electrokinetic (or zeta) potential which results in a potential difference between the surface of the bubble and the fully disassociated ionic concentration in the body of the liquid. This also applies to small particles.

According to an embodiment of the present invention, a power source or voltage supply V (or charge, voltage, electrical field or potential difference generator or supply) may be used to apply an electrical potential to one or more objects of the immersion apparatus. The principle of operation is that if repulsion is required a potential difference between the fully disassociated ionic concentration of the liquid and the object is generated, which is of the same polarity as the potential difference between the fully disassociated ionic concentration in the body of the liquid and the surface of the bubble. If attraction between the object and the bubble is required the potential differences should have the same polarity. In this way forces can be generated on the bubbles towards or away from the objects (electrodes) which are in contact with the immersion liquid.

Figure 10:
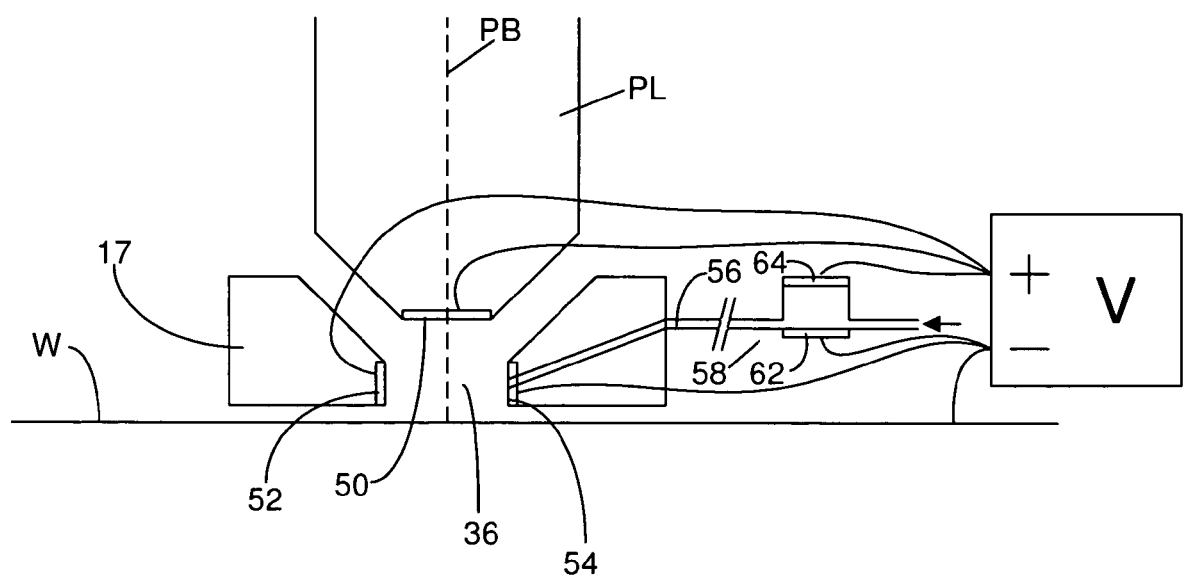
FIG. 10 illustrates several different embodiments of the present invention with a different liquid supply system to that illustrated in FIGS. 2 and 3.

In FIG. 10 several different objects have a potential or charge applied to them. This embodiment will work with only one such object and also with any combination of objects and indeed other objects to those not illustrated could be also or alternatively be used.

In pure water, which is the most promising candidate for use as an immersion liquid at 193 nm projection beam wavelength, it has been found that the surface potential of μm bubbles is about −50 mV. This potential will vary with bubble size and also with type of immersion liquid. However, the same principles as described here can be used for other immersion liquids and bubble sizes and the invention is fully applicable to those. Additives may be added to the immersion liquid to change the effect of the potential. $CaCl_2$ or NaCl are suitable candidate additions for this purpose.

In FIG. 10 six different objects are illustrated to which a potential or voltage or charge could be applied. Preferably the objects are in contact with the immersion liquid. Though in principle this is not necessary. One of these is the substrate W which is preferably charged to the same polarity of electrical potential as the electrical potential of the surface of the bubbles. In this way the bubbles have a force on them directly away from the substrate W so that their effect on the projected image is minimized. In combination with a negative potential on the substrate W, or by itself, the final element of the projection system or an object 50 close to the final element of the projection system PL can be charged to a potential opposite in polarity to the potential of the surface of the bubbles. This will have the effect of attracting the bubbles towards the final element of the projection system and thereby away from the substrate. The shape of the object 50 (electrode) close to the final element of a projection system PL could be any shape. It could be plate like or could be annular so that the projection beam PB passes through the centre of electrode 50.

Alternatively, the objects to be charged or have a voltage applied to them could be attached to a surface of the seal member 17. In FIG. 10, these objects are attached to the inner surface of the seal member 17. As illustrated, two electrodes 52, 54 are present each on opposite sides of the barrier member and charged to opposite potentials. In this way the bubbles could be drawn to one or other of the objects, perhaps in the direction of an immersion liquid outlet. Alternatively, one object or more objects may be provided around the inner side of the seal member 17 (in contact with the immersion liquid) which is/are charged to a potential with a polarity different to the polarity of the potential of the surface of the bubbles. In this way bubbles in the immersion liquid in the space 36 between the final element of the projection system PL and the substrate W will be drawn away from the optical axis of the apparatus thereby leaving the path of the projection beam PB to the substrate W substantially unhindered by bubbles.

Another place to use this embodiment is upstream of the space 36 between the final element of the projection system PL and the substrate W in the liquid supply system. In this case, as the immersion liquid passes along conduits 56 and through a housing 58, oppositely charged and opposing plates 62, 64 produce a force on the bubbles which is effective to move the bubbles, when the immersion liquid is in the space 36, further away from the substrate W than they would be without the application of the electrical field upstream of the space 36. The immersion liquid with a high concentration of bubbles i.e. near to the electrode 64, could even be removed and not supplied to the space 36. The removed liquid could be subjected to a bubble removal process before being recycled in the liquid supply system.

In all of the above examples, the higher the voltage applied by the voltage generator V the greater the force on the bubbles. The potential on the objects should not be so high as to cause disassociation of the immersion liquid but should be high enough to provide a force on the bubbles such that the invention is effective. For an immersion liquid comprised mainly of water, typical potential differences applied to the objects according to this embodiment are 5 mV to 5V, preferably 10 mV to 500 mV. An electrical field of 5 mV/mm to 500 mV/mm due to the application of the potential is preferred.

Figure 11A:
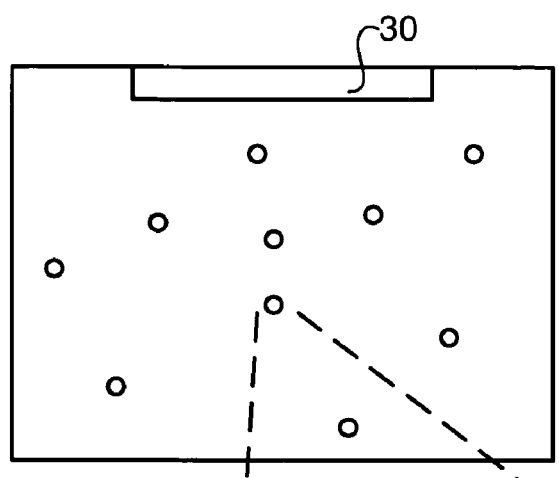
FIGS. 11a and 11b depict an embodiment of the bubble removal means arranged to selectively heat bubbles via a microwave radiation source.
Figure 11B:
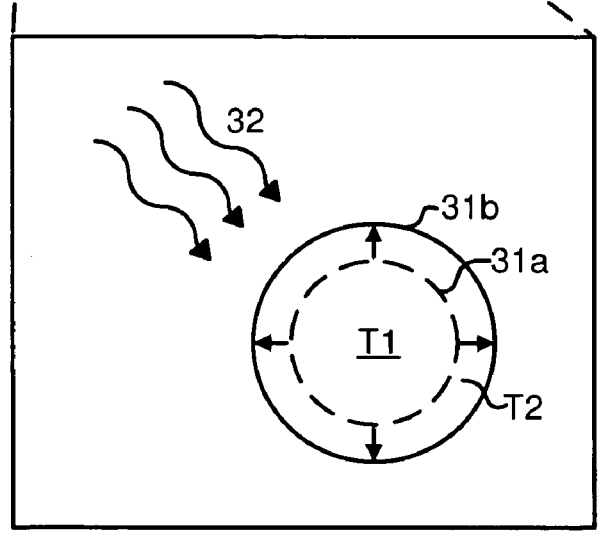

FIG. 11 illustrates an embodiment of the bubble removal means that benefits from a significantly enhanced bubble removal rate without undue influence on the immersion liquid. The improved removal rate is achieved by increasing the size of the bubbles in the immersion liquid by heating. The increased bubble size renders them more responsive to most methods of bubble removal. This is achieved without adverse heating effects in the immersion liquid, or surrounding temperature sensitive components, through the use of a microwave radiation source 30, producing radiation that couples only to the gas within the bubbles themselves and not to the immersion liquid itself. FIG. 11a, which shows a schematic magnified view of the immersion liquid, illustrating how the process operates. Microwave photons 32 are absorbed by an example bubble 31a at temperature T1, which is then heated to become a larger bubble 31b at temperature T2. Once the temperature of the bubble has been elevated above that of the surrounding immersion liquid, some rise in the temperature of the immersion liquid will inevitably occur in the immediate vicinity of each bubble. However, the combined heat capacity of the bubbles and thermal conductivity of the immersion liquid are likely to be small enough that heating of the immersion liquid can be kept within acceptable limits. In general, the frequency components of the microwave radiation are chosen to correspond with resonant frequencies or excitation modes of species present in the bubbles. For many cases of interest, a large fraction of the gas forming the bubbles will be nitrogen and oxygen, in which case the resonant modes of these molecules will dictate the microwave frequencies to use.

Figure 12:
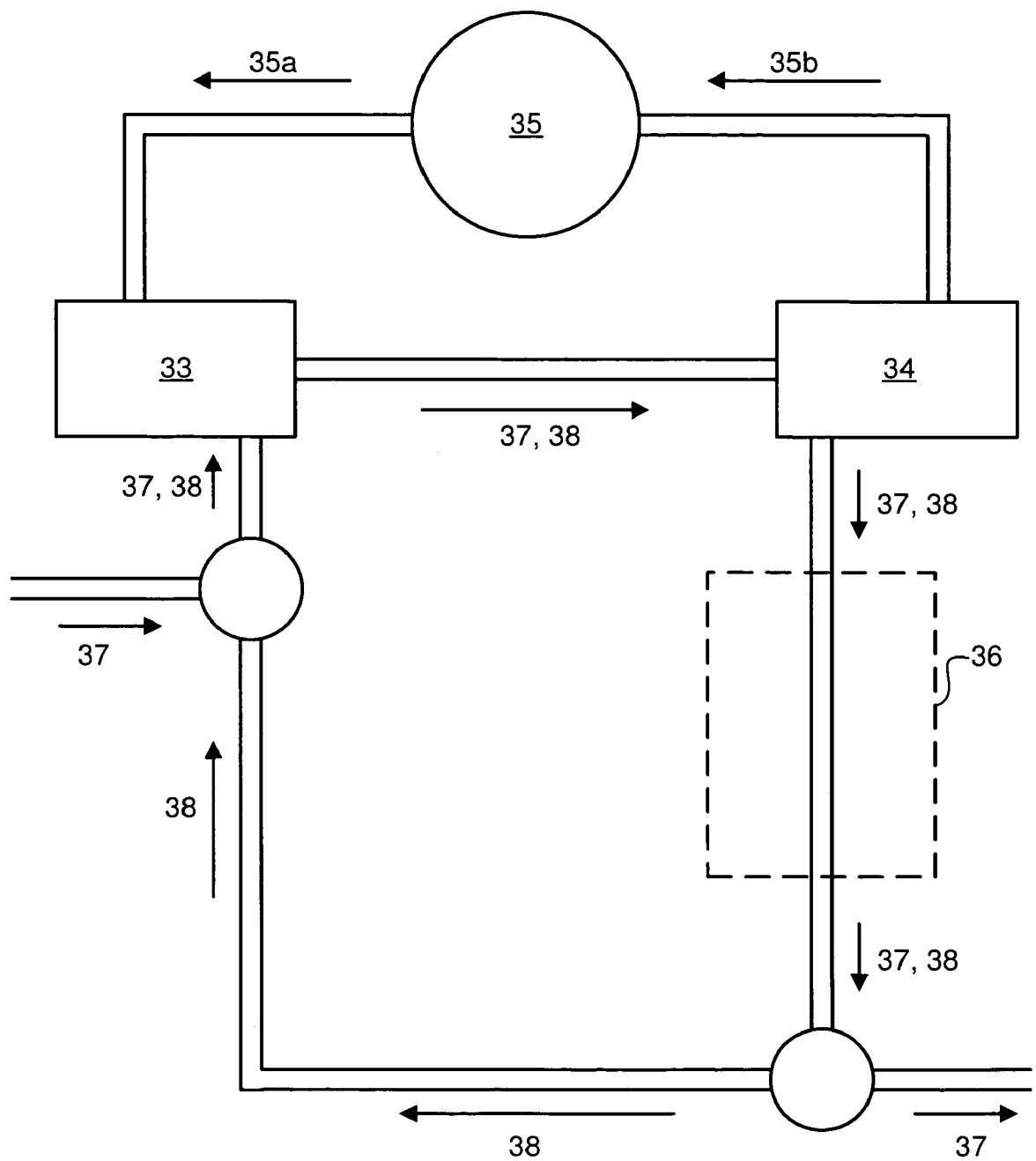
FIG. 12 depicts an embodiment of the bubble removal means comprising a particle input device and a particle removal device.

FIG. 12 illustrates an alternative embodiment of the bubble removal means. Here, a particle input device 33 introduces into the immersion liquid particles that act to attract bubbles to their surface. The particles may be mixed with the immersion liquid either by natural dispersion or deliberate agitation. The particles may be left in the immersion liquid for a period determined according to the concentration of bubbles. For example, if the bubble concentration is very high, the particles will become saturated quickly and will need to be refreshed after a relatively short time. If, on the other hand, the bubble concentration is low, the particles may remain active for a much longer time. Once the activity of the particles, or alternatively the bubble concentration, has fallen below a certain threshold level, the particles may be removed from the liquid by a particle removal device 34, which may comprise for example a particle filter. According to the embodiment of FIG. 11, the particle input device 33 and particle removal device 34 are coupled to the channels 23 for circulating the immersion liquid through the region 36 through a circuit indicated by the arrows 37 and 38. The circuit in question may be closed, as indicated by arrows 38, or involve input and output to a mains, or other, water supply as indicated by arrows 37. The used particles may be treated in a particle recycling device 35 to remove the gas bubbles from the particles. This de-gassing process may be achieved, for example, by pumping on a solution containing the particles or by pumping directly on the particles themselves. The clean particles may then be reintroduced to the immersion liquid via the particle input device 33 where they will again act effectively to trap bubbles.

Preferably the particles are arranged to have surface characteristics that encourage bubbles to attach to the surface, for example in order to lower their surface energy. In addition, it may also be preferable to arrange the particles to have as large a surface area as possible. This may be achieved by using porous particles such that bubbles may attach on surfaces within the interior of the particles. Generally this parameter may be varied by controlling the size and number distribution, and porosity of the particles. A balance may need to be achieved in pore size because although finer pores may provide the greatest additional surface area, they will exclude bubbles that are of a similar order of size or that are large in comparison with the pores (the pores may also be blocked by such bubbles). Many different particle compositions can be used, for example silica, zeolites, alumina, activated carbon, or a carbon molecular sieve. Certain polymer compositions may also be used. The particle size is a less critical factor (compared with the surface area) and a typical size range may be 5 to 1000 µm diameter.

In FIG. 12, the particle input device 33 and the particle removal device 34 are both located outside of the region 36. However, these components may also be arranged to add and remove particles directly within this region.

An alternative method for bringing the particles into the liquid is the occasional use of ultrasonic agitation in combination with non-degassed liquid. Due to cavitation of the bubbles, particles will be released from solid surfaces exposed to the liquid.

Figure 13:
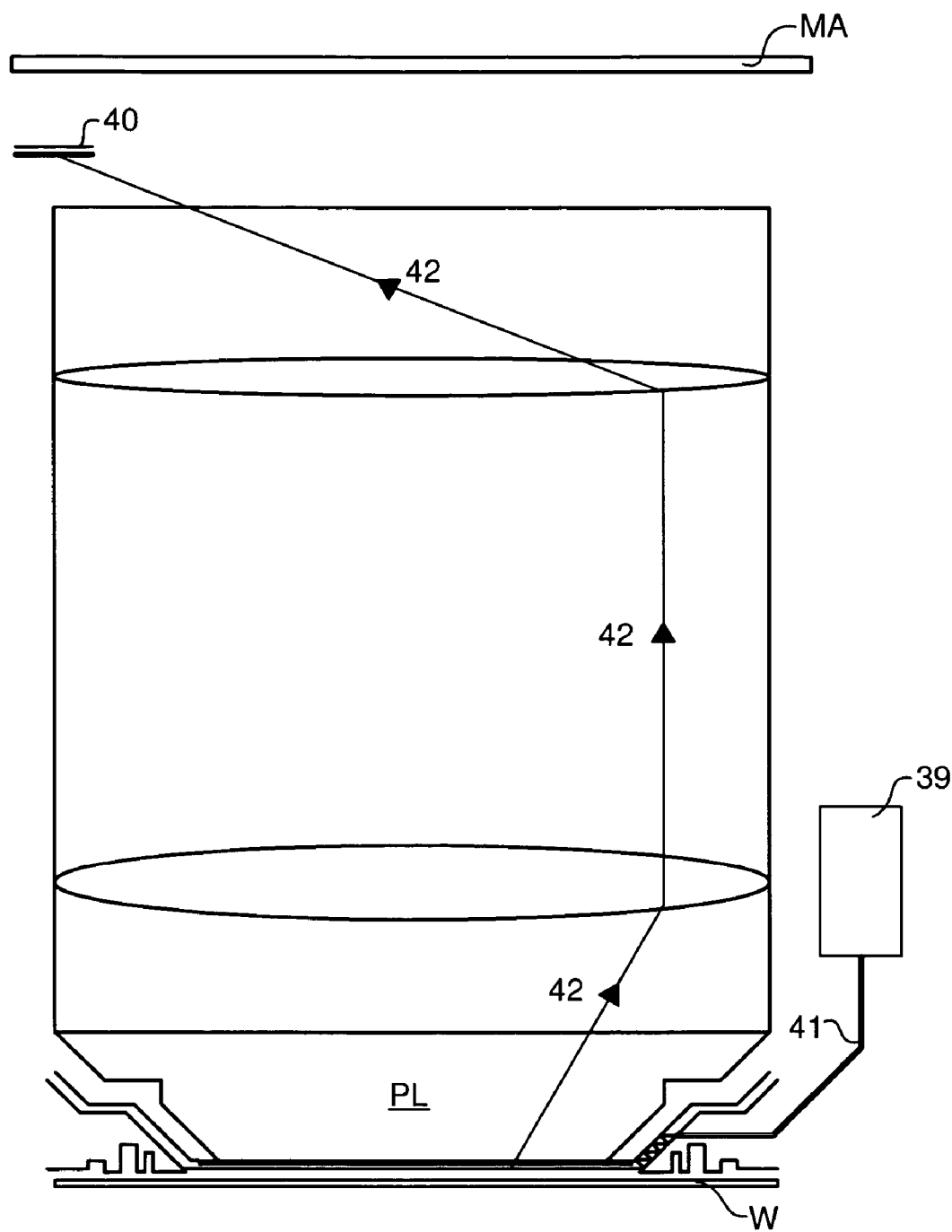
FIG. 13 depicts an embodiment of the bubble detection means showing the light source and light detector and an example trajectory for a beam of light scattered from its path within the liquid through the projection lens to the light detector.
Figure 14:
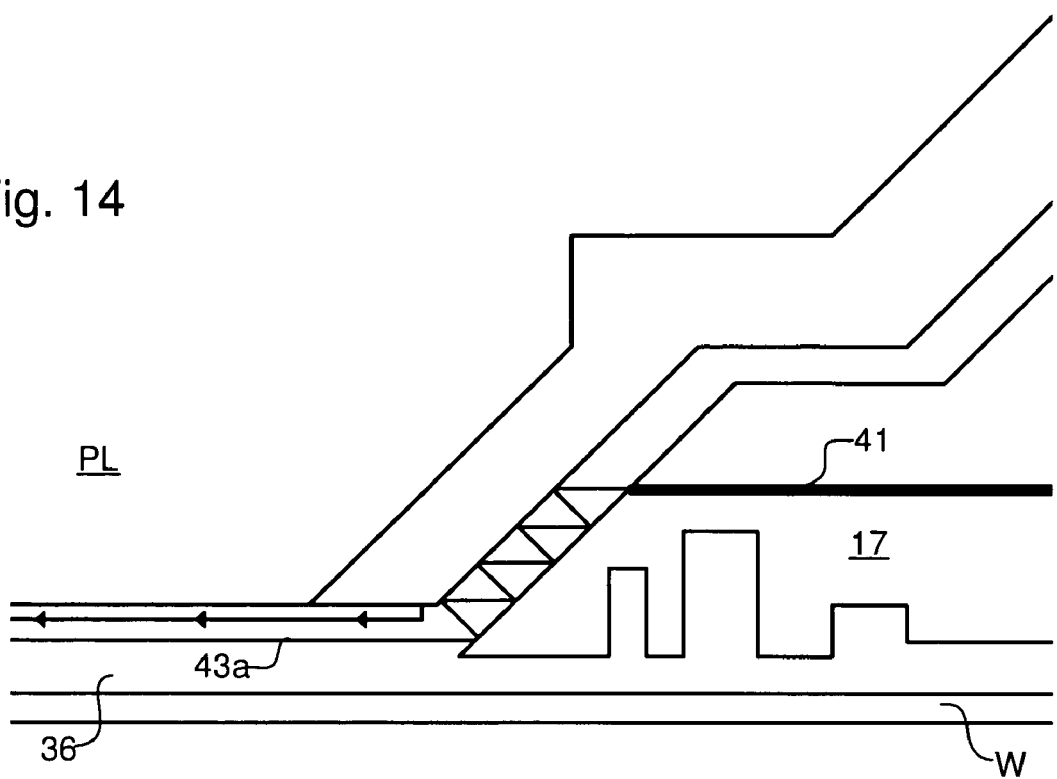
FIG. 14 depicts a larger scale view of the substrate region of the arrangement shown in FIG. 13, illustrating the introduction of light from the light source into the region between the final element of the projection lens and the substrate, according to a first embodiment of the light source.
Figure 15:
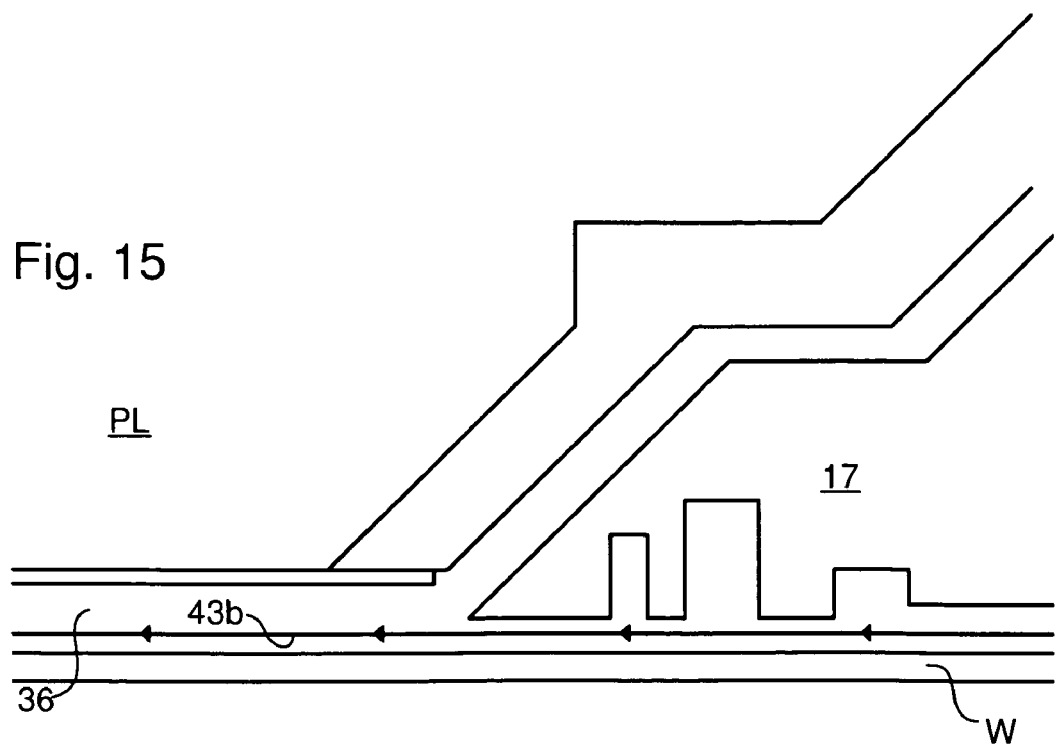
FIG. 15 depicts the same view as FIG. 14 but shows the introduction of light from the light source into the region between the final element of the projection lens and the substrate according to a second embodiment of the light source.

FIG. 13 shows a schematic representation of a section of the lithographic projection apparatus between the mask MA and the substrate W. This diagram shows several possible embodiments of the invention wherein either the bubble detection means or a detection system is arranged to propagate light between a light source 39 and a detector 40. The presence of bubbles (in the case of the bubble detection system) or particles (in the case of the detection system) is established via an increase or decrease in the intensity of light reaching the detector 40, caused by light scattering from bubbles or particles within the liquid. FIG. 13 shows one possible arrangement, with the light source 39 arranged via an optical fiber 41 to direct light rays into the immersion liquid. Light propagates through the liquid and, if bubbles or particles are present, may scatter from them. An example path for a scattered ray is shown by the arrows 42, showing propagation through the projection lens system to the detector 40. Preferably, a wavelength is chosen such that the photo resist is insensitive to the light. FIGS. 14 and 15 show magnified views of the substrate region showing how the light is fed into the immersion liquid. In FIG. 14, the optical fiber 41 is fed through the seal member 17 and makes its way into the region 36 either directly or after a number of reflections. FIG. 15 shows an alternative arrangement whereby light is introduced between the substrate W and the seal member 17. In FIGS. 14 and 15, light is shown (by arrows 43a and 43b) entering from a single direction and traversing the region 36 horizontally. However, light may be fed into the liquid from any direction and take various paths including paths comprising one or more reflections off the final element of the projection system PL and/or the substrate W. According to the embodiment illustrated in FIGS. 13 to 15, the signal strength detected at the light detector will increase as the concentration of bubbles or particles in the liquid increases due to the overall increase in scattering. However, the light source 39 and detector 40 may be arranged so that increased scattering leads to a decrease in the signal strength arriving at the detector 40. As a further variation, the optical fiber 41 may connect to both an illumination source and detector, the presence of bubbles or particles being detected by a change in the amount of light being reflected back into the optical fiber 41.

Figure 16:
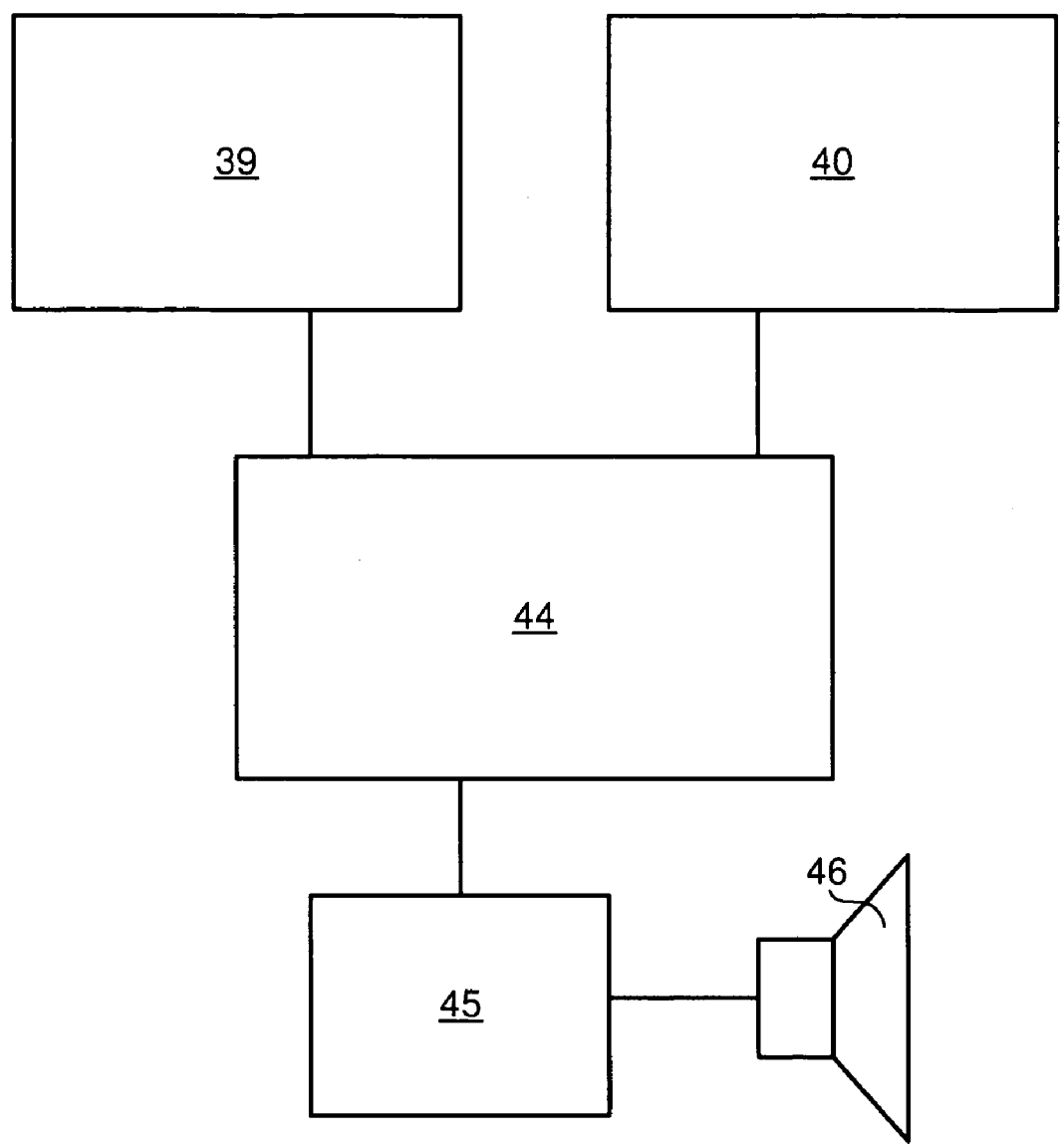
FIG. 16 depicts an embodiment of the bubble detection means comprising a light source, detector, light comparator, liquid quality monitor and alarm.

The arrangement illustrated in FIGS. 13 to 15, which in general may be described as a light scatterometer, has the advantage of allowing continuous and non-disruptive monitoring of the concentration of bubbles or particles in the immersion liquid. FIG. 16 illustrates schematically how the arrangement may be realized, with the light source 39 and detector 40 interacting with a light comparator 44. The light comparator 44 compares the light emitted by the light source 39 and the signal level arriving at the detector 40, and, depending on the arrangement of source and detector, determines information about the population of bubbles or particles present in the immersion liquid.

The light comparator 44 may interact with a liquid quality monitor 45, which may be realized by a suitably programmed computer. The liquid quality monitor 45 may be arranged to ensure that the liquid is always at a suitable level of cleanliness to ensure that the quality of the image being written to the substrate W does not fall below a minimum threshold level. The liquid quality monitor 45 may take into account, in addition to the concentration of bubbles or particles, other factors such as the chemical composition of the liquid. The liquid quality monitor 45 may in turn be coupled to an alarm system 46 that causes the system to be shut down from an active state to a suspended state, or other appropriate action to be taken, when the state of the immersion liquid falls outside predefined parameters. This early reaction to problems in the liquid allows corrective action to be taken promptly, and also minimizes the loss of materials and time associated with substandard exposures caused by low quality immersion liquid.

Figure 17:
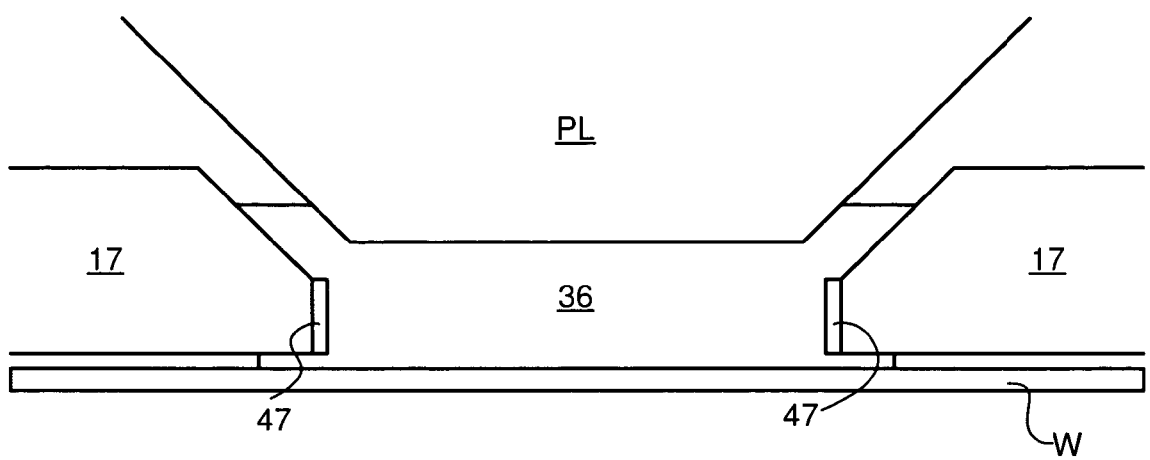
FIG. 17 depicts an arrangement of ultrasonic transducers in the region of the final element of the projection lens and the substrate according to an embodiment of the invention.

The imaging performance of the lithography system may also be affected negatively (causing stray light, for example) by contamination on the bottom part of the lens PL. Such contamination may include, for example, the formation of salts arising primarily from the resist chemicals or oxides such as $SiO_2$. The contamination may be reduced by mechanical or chemical cleaning, but such procedures involve expensive stoppages and service man hours, are not always completely effective and risk damage to the lens. According to certain embodiments of the present invention described above, one or more ultrasonic transducers are provided to detect or remove bubbles from the immersion liquid. These devices may also be oriented and configured to remove contamination from the final element of the projection lens PL and the substrate or wafer chuck W. FIG. 17 shows one possible arrangement, wherein ultrasonic transducers 47 are located on the seal member 17 and may couple directly to the liquid between the final element of the projection lens PL and the substrate W. To minimize the risk of altering the position of the lens itself during cleaning, the transducers 47 may be mechanically isolated from, or at least in damped connection with, the seal member 17. For example, the transducers 47 may be located nearby, rather than on, the seal member 17. Alternatively, the device connection to the lens PL may be mechanically released when the high frequency is generated. In the context of lens or wafer chuck cleaning, a wide variety of high frequency generators may be used that produce ultrasonic waves resonant with the immersion liquid. In practice, the ultrasonic lens and wafer chuck cleaning action may be implemented automatically and be arranged to cycle on and off according to the rate of contamination.

Whilst specific embodiments of the invention have been described above, it will be appreciated that the invention may be practiced otherwise than as described. The description is not intended to limit the invention.

The invention claimed is:

1. A lithographic projection apparatus comprising:
   a support structure configured to hold a patterning device, the patterning device configured to pattern a projection beam according to a desired pattern;
   a substrate table configured to hold a substrate;
   a projection system configured to project the patterned beam onto a target portion of the substrate;
   a liquid supply system configured to at least partly fill a space between the projection system and said substrate with liquid; and
   a selective heater configured to selectively control the temperature of bubbles in the liquid without substantially changing the temperature of the liquid.

2. A lithographic projection apparatus according to claim 1, further comprising a bubble detector.

3. A lithographic projection apparatus according to claim 2, wherein said bubble detector comprises at least one ultrasonic transducer, the attenuation of ultrasonic waves in said liquid being measured by said transducer so as to obtain information about bubbles present in said liquid.

4. A lithographic projection apparatus according to claim 3 wherein said ultrasonic transducer measures ultrasonic attenuation as a function of frequency.

5. A lithographic projection apparatus according to claim 1, further comprising a bubble removal device.

6. A lithographic projection apparatus adcording to claim 5, wherein said.bubble removal device comprises a degassing device, said degassing device comprising an isolation chamber, wherein a space above liquid in said isolation chamber is maintained at a pressure below atmospheric pressure encouraging previously dissolved gases to come out of solution and be pumped away.

7. A lithographic projection apparatus according to claim 5, wherein said bubble removal device is configured to provide a continuous flow of liquid over a final element of said projection system and said substrate to transport bubbles in said liquid out of said space between said projection system and said substrate.

8. A lithographic projection apparatus according to claim 1, further comprising a liquid pressurization device to pressurize said liquid above atmospheric pressure to minimize the size of bubbles and encourage bubble-forming gases to dissolve into said liquid.

9. A lithographic projection apparatus according to claim 1, wherein the composition of said liquid is chosen to have a lower surface tension than water.

10. A lithographic projection apparatus according to claim 1, wherein a bubble detector, a bubble removal device, or both, is configured to treat said liquid before itis supplied to said space between said projection system and said substrate.

11. A lithographic projection apparatus according to claim 10, wherein the treated liquid is kept in a sealed container, excess space in said sealed container being filled with one or more of the following: nitrogen gas, argon gas, helium gas or a vacuum.

12. A lithographic projection apparatus according to claim 3, wherein an ultrasonic transducer is arranged in a pulse-echo configuration, said transducer acting both to transmit ultrasonic waves and, after reflection, to receive ultrasonic waves that have been attenuated during propagation along a path through said liquid.

13. A lithographic projection apparatus according to claim 3, wherein said bubble detector comprises two spatially separated ultrasonic transducers, the first arranged to transmit ultrasonic waves, and the second to receive ultrasonic waves that have been attenuated during propagation along a path through said liquid between the two transducers.

14. A lithographic projection apparatus according to claim 5, wherein said bubble removaldevice includes two spatially separated ultrasonic transducers, arranged to produce ultrasonic standing-wave patterns within said liquid which trap bubbles within the nodal regions, said bubble removal device being arranged to displace said bubbles through the use of a phase-adjusting device linked with said transducers, said phase-adjusting device causing spatial. shift of nodal regions and bubbles trapped therein.

15. A lithographic projection apparatus according to claim 5, wherein said bubble removal device comprises an electric field generator configured to apply an electric field to said liquid, said electric field being capable of dislodging bubbles attached to said substrate.

16. A lithographic projection apparatus according to claim 1, wherein said selective heater comprises a microwave source.

17. A lithographic projection apparatus according to claim 2, wherein said bubble detector comprises a light source, a light detector and a light comparator, said light source and said light detector being arranged so that light emitted by said source propagates between said source and said detector through a portion of said liquid, said comparator being arranged to detect changes in the proportion of said emitted light that arrives at said detector after propagation through a portion of said liquid.

18. A lithographic projection apparatus according to claim 1, further comprising a liquid quality monitor capable of switching the operational state of the projection apparatus between an active state and a suspended state, the active state being selected when the liquid quality is determined to be above a predefined threshold and the suspended state being selected when the liquid quality is determined to be below a predefined threshold state.

19. A device manufacturing method comprising:
at least partly filling a space between a projection system of a lithographic apparatus and a substrate with liquid;
projecting a patterned radiation beam using the projection system, through the liquid, onto a target portion of a substrate; and
selectively controlling the temperature of bubbles in the liquid without substantially changing the temperature of the liquid.

20. A device manufacturing method according to claim 19, wherein selectively controlling the temperature comprises heating using a microwave source.

21. A device manufacturing method according to claim 19, further comprising producing ultrasonic standing-wave patterns within the liquid which trap bubbles within the nodal regions and causing spatial shift of the nodal regions to displace the trapped bubbles.

22. A lithographic projection apparatus comprising:
a support structure configured to hold a patterning device, the patterning device configured to pattern a projection beam according to a desired pattern;
a substrate table configured to hold a substrate;
a projection system configured to project the patterned beam onto a target portion of the substrate;
a liquid supply system configured to at least partly fill a space between the projection system and the substrate with liquid;
a particle input device configured to controllably introduce particles into the liquid; and
a particle removal device configured to remove the particles from the liquid.

23. A lithographic projection apparatus according to claim 22, wherein the particles comprise a surface with characteristics that encourage bubbles to attach thereto.

24. A lithographic projection apparatus according to claim 22, further comprising at least one ultrasonic transducer, the attenuation of ultrasonic waves in said liquid being measured by said transducer so as to obtain information about bubbles present in said liquid.

* * * * *